US006872251B2

(12) United States Patent
Takaya et al.

(10) Patent No.: US 6,872,251 B2
(45) Date of Patent: Mar. 29, 2005

(54) METHOD FOR MANUFACTURING SINGLE CRYSTAL CERAMIC POWDER, AND SINGLE CRYSTAL CERAMIC POWDER, COMPOSITE MATERIAL, AND ELECTRONIC ELEMENT

(75) Inventors: Minoru Takaya, Tokyo (JP); Yoshiaki Akachi, Tokyo (JP); Hiroyuki Uematsu, Tokyo (JP); Hisashi Kobuke, Tokyo (JP)

(73) Assignee: TDK Corporation, Tokyo (JP)

( * ) Notice: Subject to any disclaimer, the term of this patent is extended or adjusted under 35 U.S.C. 154(b) by 201 days.

(21) Appl. No.: 10/158,570

(22) Filed: May 29, 2002

(65) Prior Publication Data

US 2002/0197461 A1 Dec. 26, 2002

(30) Foreign Application Priority Data

May 31, 2001 (JP) ........................................ 2001-165931

(51) Int. Cl.$^7$ ............................................. C30B 29/22
(52) U.S. Cl. ...................... 117/73; 117/921; 117/901; 117/945; 117/946; 117/947; 117/948; 117/949; 117/75; 264/15; 501/134; 501/135; 501/136; 501/138; 501/139; 361/762; 428/693; 428/900; 428/700; 428/697; 428/699; 428/701; 428/210; 428/694 BA; 252/62.51 R; 252/62.51 C; 252/62.56; 252/62.57; 252/62.58; 252/62.59; 252/62.6; 252/62.61; 252/62.62; 252/62.63; 252/62.64; 423/593.1; 423/598; 423/610
(58) Field of Search .............................. 264/15; 117/73, 117/75, 921, 901, 945, 946, 947, 948, 949; 501/134–139; 423/592–598; 252/62.51 R–62.51 C; 361/762; 428/693, 900, 700, 697, 699, 701, 210, 694 BA

(56) References Cited

U.S. PATENT DOCUMENTS 3,502,584 A * 3/1970 Denes ...................... 252/62.55

(Continued)

FOREIGN PATENT DOCUMENTS

EP     0 644 277     3/1995
EP       644279    * 3/1995

(Continued)

OTHER PUBLICATIONS

Shim, et al., "Restructuring of Alumina Particles Using a Plasma Torch", Journal of Materials Research, Mar. 1999, Mater. Res. Soc, USA, vol. 14, No. 3, pp. 849–854.

S. Wada et al., "Crystal Structure of Barium Titanate Fine Particles Including Mg and Analysis of Their Lattice Vabration", Journal of Materials Science 35 (2000) pp. 3889–3902.

*Primary Examiner*—C. Melissa Koslow
(74) *Attorney, Agent, or Firm*—Hogan & Hartson, LLP

(57) ABSTRACT

A method for manufacturing single crystal ceramic powder is provided. The method includes a powder supply step for supplying powder consisting essentially of ceramic ingredients to a heat treatment area with a carrier gas, a heat treatment step for heating the powder supplied to the heat treatment area at temperatures required for single-crystallization of the powder to form a product, and a cooling step for cooling the product obtained in the heat treatment step to form single crystal ceramic powder. The method provides single crystal ceramic powder consisting of particles with a very small particle size and a sphericity being 0.9 or higher.

22 Claims, 9 Drawing Sheets

U.S. PATENT DOCUMENTS

| | | | |
|---|---|---|---|
| 4,755,373 A | | 7/1988 | Gherardi et al. |
| 4,756,746 A | * | 7/1988 | Kemp et al. .................. 75/342 |
| 4,956,114 A | * | 9/1990 | Watanabe et al. ........ 252/62.58 |
| 5,780,375 A | * | 7/1998 | Drozdyk ..................... 501/137 |
| 5,951,908 A | * | 9/1999 | Cui et al. .............. 252/62.9 R |
| 5,955,776 A | | 9/1999 | Ishikawa et al. |
| 6,274,224 B1 | * | 8/2001 | O'Bryan et al. ............ 428/209 |
| 2002/0017628 A1 | * | 2/2002 | Akimoto et al. ......... 252/62.56 |
| 2002/0090335 A1 | * | 7/2002 | Harada et al. ............. 423/598 |
| 2002/0193236 A1 | * | 12/2002 | Takaya et al. .............. 501/126 |
| 2004/0028592 A1 | * | 2/2004 | Akimoto et al. ............ 423/263 |

FOREIGN PATENT DOCUMENTS

| | | |
|---|---|---|
| EP | 1 170 757 | 1/2002 |
| JP | 06-077342 | 3/1994 |
| JP | 06-350284 | 12/1994 |
| JP | 07-033579 | 2/1995 |
| JP | 07-187612 | 7/1995 |
| JP | 08-325062 | 12/1996 |
| JP | 09-169523 | 6/1997 |
| JP | 09-263496 | 10/1997 |
| JP | 10-012446 | 1/1998 |
| JP | 2002-025816 | 1/2002 |

* cited by examiner

METHOD FOR MANUFACTURING SINGLE CRYSTAL CERAMIC POWDER, AND SINGLE CRYSTAL CERAMIC POWDER, COMPOSITE MATERIAL, AND ELECTRONIC ELEMENT

BACKGROUND OF THE INVENTION

1. Field of the Invention

The present invention relates to a method for manufacturing single crystal ceramic powder, and single crystal ceramic powder, composite material and electronic elements using the single crystal ceramic powder.

2. Description of Related Art

Ceramic powder has been used for many years, including dielectric powder and magnetic ferrite powder. For example, as dielectric powder, barium titanate and titanium oxide excel in dielectric properties, piezoelectric and pyroelectric properties and are used as materials for ceramic capacitors, filters and sensors.

When using ceramic powder for ceramic capacitors, those with high dielectric properties and small losses are desirable. When using these powders for magnetic ferrite material, the desirable types are those with small losses and magnetic permeability that extends flatly to the high frequency range.

The characteristics of powder depend on the shape, particle size, purity and reactive properties of the ceramic powder. For example, if the ceramic powder is the polycrystalline type or comes in indeterminate shape, they could cause localized abnormal growth or uneven composition, inviting deterioration of magnetic characteristics or electrical characteristics. Therefore it is preferable that the ceramic powder has no crystal particle boundary or impurities, but is single-phase and single crystal. Moreover, in order to further acquire superior characteristics, it is preferable for the ceramic powder to be a compound of two or more types of metals and oxygen.

However, it is difficult to manufacture ceramic powder with superior characteristics. For example in solid-phase reaction method, it is possible to obtain a metal oxide dielectric compound of more than two types of metal and oxygen by firing the mixed powder of metal oxide within the atmosphere or in inert gas in accordance with the composition of the final formed product. However, it is difficult to obtain a single-phase powder. Also, in liquid phase methods, including co-precipitation method, the precursor (primary particle) of the metal oxide such as hydrates is made from the aqueous solution or organic solvent solution of metallic salts. This precursor is fired in the atmosphere or inert gas environment to create ceramic powder. However, it is difficult to obtain a dielectric powder with excellent crystallinity. Moreover, because the bonding of the metal oxide precursor is ultimately obtained as a large mass, it is necessary to pulverize the dielectric substance after the firing to obtain powder with dielectric properties. In powders obtained in such a manner, the shapes of individual particles are irregular, and the distribution of particle size will become expansive and there is a strong possibility of impurities becoming mixed in.

Therefore, while the hydrothermal synthesizing method and gas phase reaction method that improve the shape of the powdered particles and particle size distribution have been proposed, it will be difficult to manufacture the powder industrially in terms of productivity and cost. Also, a method has been proposed to obtain single crystal powder with uniform particle size by forming minute oxide particles from raw materials melted in solvents by using hydrolytic decomposition and co-precipitation method, crystallizing and growing particles after heat treating the fine powder, and dissolving and eliminating the glass included in the resulting product.

However, this method requires complex processes, and will render it difficult to produce the powder industrially.

Moreover, according to another method, barium titanate single crystal is obtained by sintering barium titanate with a mean particle size of less than 10 $\mu$m at temperatures ranging from 1,200° C. to less than 1,618° C. Under this method, barium titanate single crystal is formed by causing abnormal crystal grain growth of barium titanate by sintering the compound at temperatures lower than its melting point and by giving a temperature gradient during the sintering process. However, this method produces large size barium titanate particles of about 500 $\mu$m, and cannot produce fine particles. Moreover, in this method, the single crystals are obtained within polycrystalline particles, and therefore an additional process is needed to immerse the polycrystalline particles in concentrated hydrochloric acid to destroy the polycrystalline parts to obtain the single crystals.

While ceramic powders are used alone in their powder form, they are also used as composite materials with the powder dispersed in resin material. Ceramic powder used as composite material requires dispersion and filler-type properties for resin materials. One of the elements for securing dispersion and filling properties for resin material is the particle size of the fine particles comprising the powder. However, in the ceramic powder obtained through the aforementioned co-precipitation method, the dispersion and filler properties cannot be secured for resin material because the particles are too fine. Also, as for ceramic powder obtained through the liquid phase method described earlier, the shape of the powdered particles is irregular as the powder was obtained through pulverization, and therefore, the dispersion and filler properties for resin material cannot be secured. Moreover, as for the barium titanate single crystal obtained by the second conventional method described above, it would be difficult to obtain a high degree of filler property because particle size would be too large.

SUMMARY OF THE INVENTION

The present invention pertains to a method for manufacturing single crystal ceramic powder with excellent characteristics, and single crystal ceramic powder, composite material and electronic elements using the single crystal ceramic powder.

The inventors of present invention discovered that single crystal ceramic powder is easily manufactured by suspending and carrying ceramic-ingredient powder in a gaseous current through a heat treatment area and then by cooling off the powder. By this method, single crystal ceramic powder particles with a high degree of sphere (i.e., sphericity) can be easily obtained. And, by using such near spherical and fine single crystal ceramic powder, it enhances the ease in using the powder as filler to create composite material with resin to effectively exert the characteristics of the powder.

The present invention is based on the discovery described above, and pertains to a method for manufacturing single crystal ceramic powder, which comprises a powder supply step in which powder consisting of ceramic ingredients is supplied to a heat treatment area with carrier gas; a heat treatment step in which the powder supplied to the heat treatment area is heated at temperatures necessary for creating single crystals, for example, at temperatures exceeding the powder's melting point for creating single crystals; and a cooling step in which the material obtained from the heat treatment step is cooled in a crystallization process to change the material into single crystal ceramic powder.

When this manufacturing method is used, single crystal ceramic powder with a sphericity being 0.9 or higher can be obtained.

In the heat treatment step of the manufacturing method described above, single crystal ceramic powder with excellent crystalline properties and a high sphericity can be obtained by melting and forming a melt from powder made of ceramic ingredients and then, crystallizing the substance during the cooling process. After subjecting the substance to the melting step during the heat treatment step, single crystal powder can be produced with less energy by crystallizing the substance by continuously passing them through the cooling step. In this case, the heat treatment step may preferably be conducted in an electric tube type furnace. Heating the substance in an electric tube type furnace facilitates the control of temperature and temperature profile. Thus, this is preferred in the manufacturing process.

Single crystal ceramic powder with particle size of about 30 $\mu$m or less may be obtained if the powder form comprising ceramic ingredients is formed by particles of about 50 $\mu$m or less.

Also, when the ceramic powder is in granule created from primary particles with its mean particle size being about 1 $\mu$m or less, single crystal ceramic powder with small particle size can be obtained, which is desirable.

The method for manufacturing single crystal ceramic powder of the present invention may be viewed from another perspective as a manufacturing method in which single crystal ceramic powder with a sphericity being more than about 0.9 can be obtained by suspending and moving a powder form made of ceramic ingredients through a heater furnace and cooling the resultant substance. In this manner, single crystal ceramic powder with excellent spherical characteristics can be obtained by heating ceramic powder in a state of suspension or floating.

The single crystal ceramic powder obtained by the present invention has a mean particle size of about 0.1–30 $\mu$m and features a sphericity of about 0.9 or greater. This single crystal ceramic powder has a small particle size and a high degree of spherical properties. Thus, it has excellent characteristics and is particularly advantageous when used as fillers for resin.

This single crystal ceramic powder is formed from, for example, oxide magnetic materials or oxide dielectric materials, thus showing excellent magnetic characteristics and electrical characteristics.

If the mean particle size of this single crystal ceramic powder is about 1–20 $\mu$m, the filling characteristics will even be better.

The present invention is applicable in composite materials consisting of single crystal spherical oxide powder formed from magnetic or dielectric substance, and a bonding material for dispersing and retaining the above-described spherical oxide powder. And, in this composite material, the spherical oxide powder includes particles with a mean particle size of about 0.1–30 $\mu$m and a sphericity of about 0.9 or higher. By using fine powder with a high degree of spherical characteristics, the powder can exert its inherent characteristics with the improvement of its filler characteristics with resin to create composite materials.

In the composite material mentioned above, resin may be used as the bonding material. In this case, the spherical oxide powder content may preferably be within the range of about 30–98 wt %.

Also, in the composite material described above, the spherical oxide powder may consist of dielectric material. And, in the present invention, it is possible to compose the bonding material with a dielectric material with a lower melting point than the dielectric material that constitutes the spherical oxide powder. In this case, the content of the spherical oxide powder may preferably be within the range of about 30–70 volume % (vol. %).

Moreover, in the composite material described above, the spherical oxide powder may comprise of magnetic material. And, in the preset invention, it is possible to compose the bonding material with a magnetic material with a lower melting point than the magnetic material that constitutes the spherical oxide powder. In this case, the content of the spherical oxide powder may preferably be within the range of about 30–70% in terms of its volume.

The present invention provides an electronic component that uses any one of the composite materials described above. The electronic component is a component which has internal metal electrodes arranged within dielectric layers, wherein the dielectric layer is formed from a composite material consisting of spherical oxide powder consisting of dielectric material and a bonding material in which the spherical oxide powder is dispersed and retained. The spherical oxide powder may preferably have a mean particle size of about 0.1–30 $\mu$m and a sphericity of about 0.9 or higher.

Moreover, the present invention provides an electronic component that contains interior metal electrodes arranged within magnetic layers, wherein the magnetic layer is formed from a composite material consisting of spherical oxide powder consisting of magnetic material and a bonding material in which the spherical oxide powder is dispersed and retained.

Other features and advantages of the invention will be apparent from the following detailed description, taken in conjunction with the accompanying drawings that illustrate, by way of example, various features of embodiments of the invention.

PREFERRED EMBODIMENTS

Embodiments of the present invention will be described with reference to the accompanying drawings.

Figure 1:
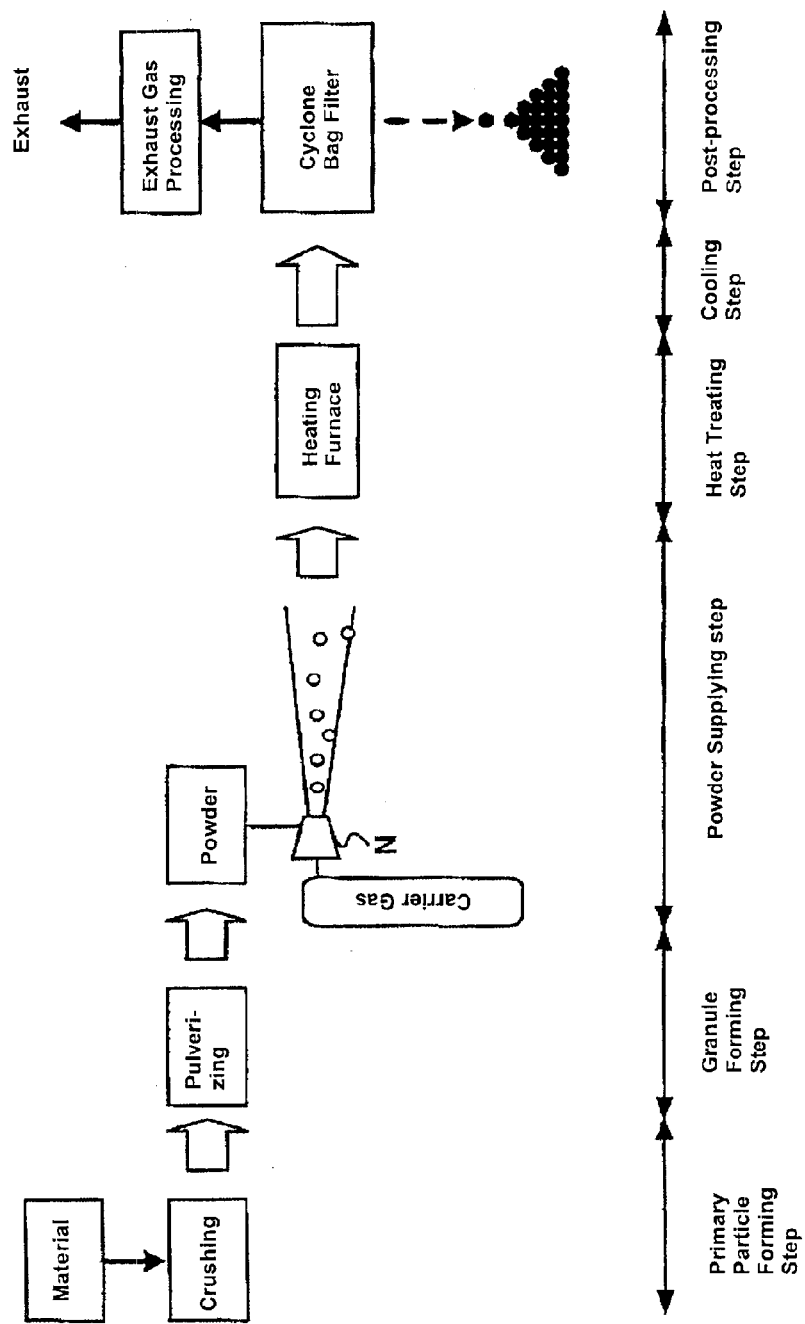
FIG. 1 shows an example of a process for manufacturing ceramic powder in accordance with one embodiment of the present invention.

An outline of a manufacturing process for manufacturing single crystal ceramic powder in accordance with one embodiment of the present invention is explained with reference to FIG. 1. As shown in FIG. 1, the manufacturing method in accordance with the present embodiment includes a primary particle forming step in which raw materials are crushed to obtain primary particles, a granule forming step for forming granules from the primary particles, a powder substance supply step that supplies powder consisting of the granules, a heating process that heats the supplied powder to a prescribed temperature, a cooling step for cooling substance obtained from the heating process, and a post-processing step.

First, primary particles are formed from raw materials comprising ceramics in the primary particle forming step. In this step, the raw materials comprising ceramic ingredients are pulverized and adjusted so that the mean particle size is preferably 1 $\mu$m of less. This particle size not only affects the particle size of particles in single crystal ceramic powder ultimately obtained, but also enhances the quality of single crystal ceramic powder when the primary particles of this size are used. While the crushing or pulverizing step is not necessarily limited to a specific method, a ball mill method, for example, may be used.

The ceramic ingredients in the embodiment of the present invention encompass such compounds as oxides, nitrides and carbides that could be recognized as ceramics. They also encompass not only single unit ceramics but also compounds of more than one ceramic, and composite compounds of composite oxides and composite nitrides. As specific examples of ceramic ingredients, dielectric materials and magnetic materials can be listed.

Examples of dielectric materials include: barium titanate-neodymium ceramics, barium titanate-tin ceramics, lead-calcium ceramics, titanium dioxide ceramics, barium titanate ceramics, lead titanate ceramics, strontium titanate ceramics, calcium titanate ceramics, bismuth titanate ceramics, magnesium titanate ceramics, $CaWO_4$ ceramics, Ba (Mg, Nb) $O_3$ ceramics, Ba (Mg, Ta) $O_3$ ceramics, Ba (Co, Mg, Nb) $O_3$ ceramics and Ba (Co, Mg, Ta) $O_3$ ceramics. These can be used alone or in mixture form of two or more types. Also, titanium dioxide ceramics include those that consist of a composition of titanium dioxide only or titanium dioxide with small amount of additives. They mean that the crystal structures contain titanium dioxide as the main ingredient. The same can be said of other ceramics. Also, while titanium dioxide is represented by as $TiO_2$ and contains several types of crystallized structure substances, the one used as dielectric ceramic has a rutile structure.

Oxides with magnetic properties are used as magnetic material. For example, these will include Mn—Zn type ferrite, Ni—Zn type ferrite, Mn—Mg—Zn type ferrite and Ni—Cu—Zn type ferrite. It could also be iron oxides that include $Fe_2O_3$, $Fe_3O_4$, or the like.

Also, commercially available ceramics may be used for the ceramic ingredients. Moreover, it is possible to obtain ceramic ingredients by firing materials and components used for forming ceramic ingredients. For example, after creating composite granular oxides through the mixture of barium oxide and titanic acid, barium titanate ceramic ingredients can be obtained by firing and reacting the composite oxide crushed to suitable size.

Next, in the granule forming step, the granules are formed from the primary particles obtained as above. More specifically, a slurry is created to spray the primary particles from a nozzle. The slurry is obtained by adding a suitable amount of primary particles in a solvent and then mixing them by using a mixing machine, including a ball mill. While the solvent may be water or ethanol, a dispersant may preferably be used to enhance the dispersion of the primary particles. The amount of dispersant is about 1% of the weight of the primary particles. It is also possible to add polyvinyl alcohol (PVA) as the bonding agent to mechanically bind the primary particles. Droplets are formed by spraying the slurry through a nozzle.

The spray nozzle used here is to spray the slurry described above and compressed gas. The two-fluid type and four-fluid type nozzles may be used. The slurry ejected by the spray nozzle with the compressed gas (for example air, nitrogen gas etc.) is broken up into fine particles to form a spray. The size of the droplets in the spray can be controlled with the ratio of the slurry and the compressed gas. By controlling the size of the droplets, it is possible to control the particle size of the single crystal ceramic powder ultimately obtained. The spraying process with the spray nozzle is performed in a prescribed chamber. Also, it is permissible to obtain the granules through the spray drying method that combines drying during the heating process. If the spray drying method is used, the quality of the ultimate product obtained is reliable because, unlike pulverized powder, it is rare for unusually large powder particles to be mixed in the product.

In this manner, when a spray nozzle is used, it is possible to obtain granules small enough in particle size so that they would be suitable for use in the present invention. For example, fine granular powder with particle size of about 1–20 $\mu$m can be obtained. This particle size will affect the particle size of the single crystal ceramic powder ultimately obtained. As explained previously, the particle size can be controlled with the ratio of slurry and the compressed gas. Moreover, it is possible to create smaller droplets by clashing the slurry against each other. Therefore, the granules obtained in this manner are sent to the powder substance supply step.

In the powder supply step, the granules obtained from the granule forming step is supplied as the powder substance comprising ceramic ingredients to the heating regions together with carrier gas. To realize the powder supplying step in accordance with an embodiment, FIG. 1 shows an example of a structure in which the carrier gas and the granules are prepared separately, and the granules are sent to the heating process step with the carrier gas via a nozzle N. Various types of gasses may be used for the carrier gas, such as air, nitrogen gas, Ar gas and Ne gas. As for materials that require heat of 1,300° C. or more, Ar gas and Ne gas are recommended when considering the emission of NOx in the heating process.

The method for supplying ceramic-ingredient powder from the powder supply step to the heating step is not limited to the method indicated in FIG. 1. For example, it is possible to use a method for supplying the ceramic-ingredient powdered substance to the heating process step by blowing compressed gas, including the carrier gas, against the powder. Also, there are ways to supply the powder by a dispersant machine, or by using the output from a classifying machine or pulverizing machine. That is, by classifying or pulverizing the substance it is possible to send powder to the heat processing stage from the output side.

In this embodiment, the spraying of ceramic-ingredient powder may either be in the form of dry powder or in a wet state that may contain water, etc.

Next, in the heating process step, single crystal ceramic powder is obtained by sintering the ceramic-ingredient powder supplied through the spray nozzle from the powder supply step to the heating process step. The heating process is realized through a heating furnace. Such known heating methods as electric heating, heating with the combustion heat of gas and radio-frequency heating can be used. Especially, if the electric tube type furnace is used, it is easier to control the environment within the furnace compared with the method using gas combustion. The powdered substances made of ceramic ingredients are formed into single crystals and spheres in a suspended state within the heating furnace together with the carrier gas that creates the current in the furnace. The flow speed of the ceramic-ingredient powder can be suitably set in accordance with the collecting efficiency and pyrolysis temperature. However, it is preferable that the flow speed be kept within the range of about 0.05–10 m/s, preferably about 1–5 m/s. The flow speed of the powder can be changed by controlling the flow speed of the carrier gas. At this time, it is preferred that the speed is controlled so that the ceramic-ingredient powder be maintained in the heating furnace for about 1–10 seconds. However, it is desirable that the flow speed is slower than the critical cooling speed to prevent non-crystallization of the ceramic powder.

The critical cooling speed differs with the substance. For example, in the case of barium titanate, the critical cooling speed is $1.3 \times 10^6$ (k/sec). If the cooling is faster than the critical speed, the ceramic powder obtained becomes glass (amorphous). The time necessary for growing single crystals depends on the particle size. The smaller the size, the shorter the time becomes.

The conditions for heating, notably the temperature and time, are suitably determined by the composition of the ceramics. As heating conditions, such heating furnace environment as oxidation, reduction or inert gas is selected in accordance with the type of single crystal ceramics powder, the final product targeted, such as dielectric material or magnetic material. Moreover, according to the selected environment, the carrier gas is selected, or the necessary gas is supplied within the heating furnace.

As for the heating temperature, the temperature that crystallizes the ceramic-ingredient powder into single crystals is set. Specifically, the temperature is set higher than the melting point of the ceramic powder. By heating the powder at temperatures exceeding its melting point, the ceramic powder melts to give single crystal. Also, since the ceramic ingredient powder melts, the shape of the ceramic powder obtained from surface tension becomes closer to a true spherical shape.

When solid phase ceramic-ingredient powder is fed to the heating furnace in a dry state, like in the present embodiment, it is possible to produce the crystals with less energy, as compared to the spray heat decomposition method that feeds the powder by dispersing them into fluid because there is no loss of heat resulting from the presence of fluids. In this case, for example, the granules formed in the granule forming process step can be sent directly to the furnace, which is the heat processing stage, with the carrier gas, without temporarily retaining and storing the granules.

The product obtained from the heat processing stage is sent to the cooling process step. Specifically, the cooling is performed by creating a cooling zone within the heating furnace or by ejecting the product into atmospheric environment from the furnace with the carrier gas. The cooling may be performed by leaving the formed product stand in the atmosphere or by forcefully cooling it with a cooling agent. The desired single crystal ceramic powder is obtained by having the formed product pass through the cooling step. By cooling the formed product at a relatively rapid pace, the spherical shape of the product is maintained. Also, in the cooling step, as the heated powder is cooled as is, it is possible to obtain single crystal ceramic powder with a small particle size of about 0.1 $\mu$m–30 $\mu$m. Preferably, powder with a particle size of about 1–20 $\mu$m is obtained.

After the cooling, the powder is collected by using a cyclone or bag filter. As for the carrier gas, this is discharged after it is subjected to a proper exhaust gas processing.

The single crystal ceramic powder thus obtained is in single crystal and spherical form. A "spherical" form here means a perfectly spherical form with a smooth surface or a polyhedron extremely close to a perfectly spherical form. For example, the spherical particle includes a polyhedral particle having an isotropic symmetry surrounded by stable crystalline faces and having a sphericity close to 1, as seen in the Wulff model. What is meant by "sphericity" is Wadell's practical sphericity, that is the ratio of a diameter of the smallest circle circumscribing a projected image of a particle with a diameter of a circle having an area equal to that of the projected image of the particle. In this embodiment, the preferred sphericity is from 0.9 to 1, or more preferably from 0.95 to 1. The sphericity of 0.9 or higher facilitates the dispersion of the single crystal ceramic powder uniformly in resin material when used in composite material. Moreover, when fired, cracks caused by non-uniformity rarely occur.

In this manner, the single crystal ceramic powder obtained from this embodiment is single phased and has no crystal particle boundary or impurities. Because of this, the single crystal ceramic powder shows excellent characteristics that contribute to the enhancement of dielectric or magnetic properties when used as dielectric or magnetic material.

Also, when single crystal ceramic powder is formed under the method described in this embodiment, no toxic gas is generated because acids and organic solvent used in the conventional methods are not used. Moreover, the powder can be produced by using relatively inexpensive facilities. The powder comprising ceramic ingredients supplied in the powder supply process step includes powder, granular powder and crushed powder and includes various forms and shapes that constitute the particles. Therefore, the powder fed from the powder supply process step is not necessarily limited to the granular particles described above, but may be a powder form obtained through the pulverization of ceramic ingredients. In this case, the use of powder with relatively large particle sizes makes it possible to form relatively large particle single crystal ceramic powder. Specifically, it is possible to form single crystal ceramic powder having a particle size of 30 μm or less by using particles having a particle size of 50 μm or less.

Moreover, in this embodiment, single crystal ceramic powder with small particle size and good spherical properties may be obtained. This type of single crystal ceramic powder has low cohesive properties and excellent dispersion and filler properties. Therefore, the single crystal ceramic powder thus obtained may be used to form a composite material by mixing a bonding agent that disperses and retains this single crystal ceramic powder.

Resin may be used as the bonding material. In this case, preferably, about 30–98 wt % of single crystal ceramic powder is used in the composite material. As for the resin, thermoplastic resin or thermosetting resin may be used. Specifically, these resin may include at least one of the following types of resin material: epoxy resin, phenol resin, polyolefin type resin, polyimide resin, polyester resin, polyphenylene oxide resin, melanin resin, cyanate ester type resin, diallyl phthalate resin, polyvinyl benzyl ether compound resin, liquid crystal polymer, fluoride type resin, polyvinyl butyral resin, polyvinyl alcohol resin, ethyl cellulose resin, nitro cellulose resin and acrylic resin.

When single crystal ceramic powder consists of dielectric material, it is possible to use for the bonding material dielectric material with melting point lower than that of the aforementioned dielectric material. While this makes possible the manufacturing of composite dielectric material sintered at a lower temperature, it makes it possible to obtain characteristics that had been previously obtainable only through high temperature sintering. In view of sintering, the low melting-point dielectric material that forms the bonding material may preferably be composed of powder whose particle size is smaller than that of the single crystal ceramic powder. This is to uniformly disperse the single crystal ceramic powders by filling in the gaps between the single crystal ceramic powders by using such powder with smaller particle size than those of single crystal ceramic powder.

The concept above can be applied even if the single crystal ceramic powder consists of magnetic material. In other words, what can be obtained is a composite magnetic material consisting of dispersed and retained single crystal ceramic powder comprising magnetic material with relatively high melting points in a magnetic material with a relatively low melting point.

Figure 11:
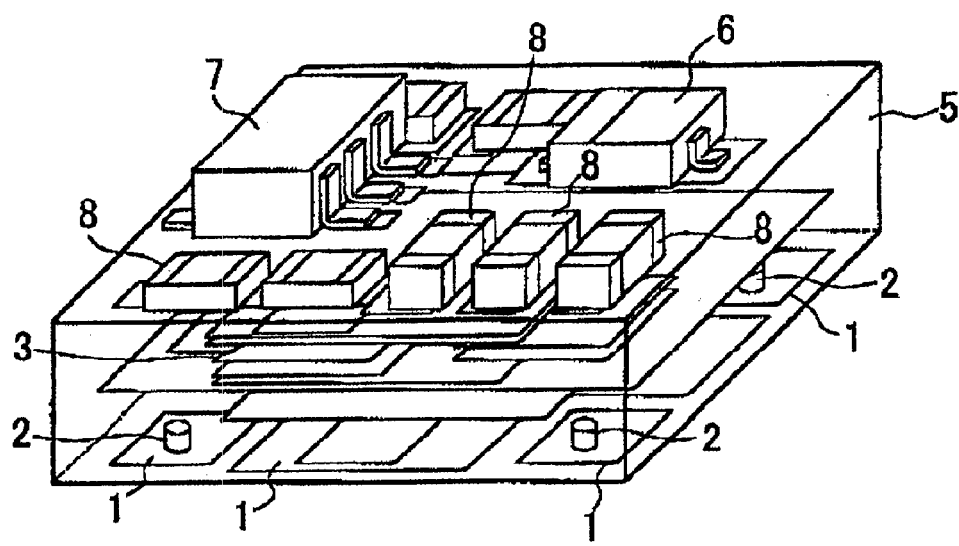
FIG. 11 is a perspective view of a high frequency module in which the present invention is applied.
Figure 12:
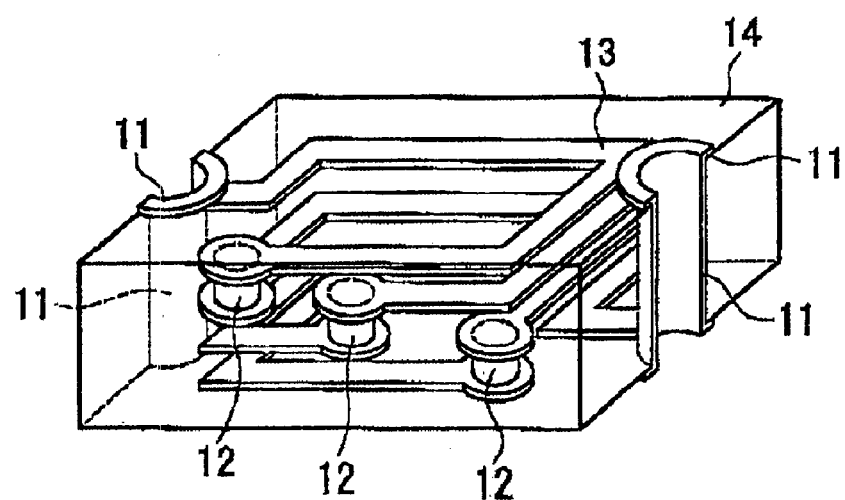
FIG. 12 is a perspective view of a chip coil in which the present invention is applied.

In this invention, the composite materials described above can be applied in various electronic components. One of the examples is shown in FIGS. 11 and 12. FIG. 11 is a perspective view of a high-frequency module, an example of an electronic component. This high-frequency module mounts a diode 6, a transistor 7 and chip resistors 8 on a surface of a composite dielectric layer 5. Moreover, the high frequency module has ground electrodes 1 on the rear side and interior of the composite dielectric layer 5. Moreover, the high frequency module has through-hole conductors 2 and a capacitor formed electrode 3 in the interior. And, the composite dielectric materials explained above are applied on the composite dielectric layer 5. FIG. 12 is a perspective view of a chip coil, which is another example of an electronic component. In this chip coil, external terminal electrodes 11 are formed on the side surface of a composite magnetic layer 14. And, the composite magnetic materials explained above are applied on the composite magnetic layer 14. The above is merely an example of electronic components. Needless to say, the composite magnetic material can also be applied on substrates and other electronic components.

The present invention will be explained below using embodiment examples.

EMBODIMENT EXAMPLE 1

Slurry was made by mixing barium oxide (BaO) and titanium oxide ($TiO_2$) powder at a weight ratio of 1:1 to form powder, adding water and mixing the powder for 12 hours in a ball mill (hereafter referred to as No. 1 slurry). Prior to the mixing, however, a dispersant (A-30SL manufactured by Toa Gosei Co.) was added at a weight percentage of 1% to the powder.

No. 1 slurry was dried and granulized with a spray-type drier. While there are no special restrictions for the spray and drying conditions, it is recommended that conditions be set so that the particle size of the granular powder be less than 200 μm.

By firing the granular powder so obtained for one hour at 1,250° C., barium titanate was obtained as a sintered composite oxide. After water and dispersant (A-30SL manufactured by Toa Gosei Co.) were added to the sintered oxide at a weight percentage of 1%, the mixture was pulverized in a ball mill for 48 hours to create a slurry (No. 2 slurry) that includes powder with primary particles whose mean particle size measured 0.3 μm. To this No. 2 slurry, polyvinyl alcohol (PVA) solution diluted to 10 wt % ratio was added at a ratio of 2 wt % against the powder. Moreover, adjustment was made to maintain the powder within No. 2 slurry at 40 wt %.

The spray drying method was used to create granular powder from the No. 2 slurry. The spray drying apparatus used was the MDL-050 manufactured by Fujisaki Denki Co. Using a four-fluid type nozzle, the spray drying condition was set at solution feeding volume of 40 cc/min., nozzle volume of 160 NL/min. and gas supply temperature of 190° C. The granular powder, thus obtained, had a mean particle size of 9.7 μm.

Next, the ball mill condition for creating primary particles was altered to obtain granular powder by using the same condition except for the fact that powder with a mean particle size of 1.5 μm was used as the primary particle. The granular powder obtained then had a mean particle size of 58 μm, thus verifying that it would be difficult to maintain the mean particle size at below 30 μm.

Using nitrogen as the carrier gas, the granular powder thus obtained was sent to a heating furnace consisting of a ceramic tube and using electricity as the heating source. The temperature within the furnace (heat processing temperature) was 1,650° C. Also, the carrier gas flow was set at 1 l/min. and an adjustment was made to set the time the granular powder stays in the ceramic tube at about 1–10 seconds.

Figure 2:
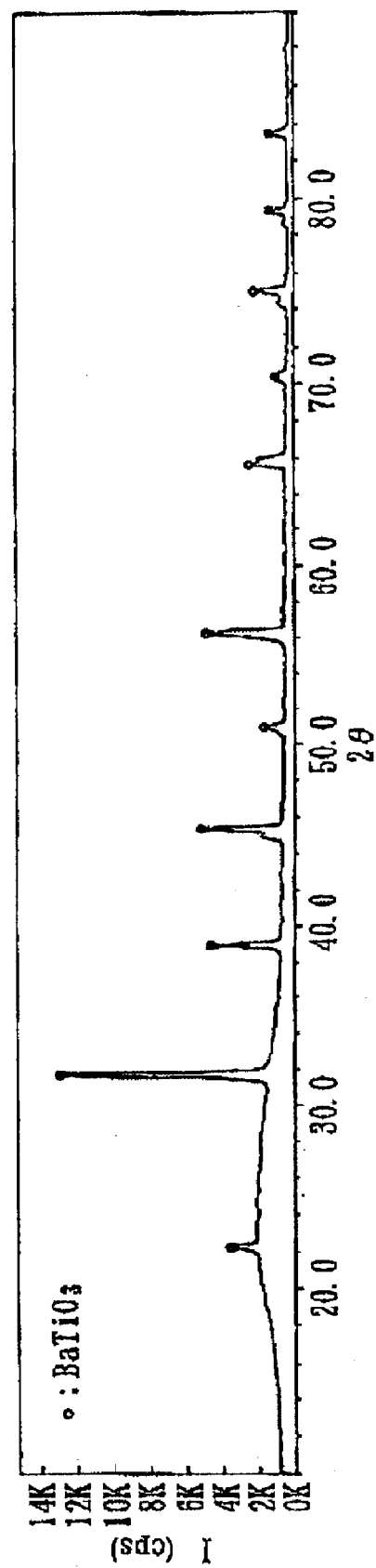
FIG. 2 shows a chart of results of an x-ray diffraction analysis conducted on ceramic powder obtained in accordance with a first embodiment of the present invention.

The composition of the powder that passed through the ceramic tube was observed with X-ray diffraction, using a fluorescence X-ray diffraction equipment. The results of the x-ray diffraction are shown in FIG. 2. As indicated in FIG. 2, the powder thus obtained was verified to be ceramic powder composed of single phase barium titanate ($BaTiO_3$) because only the peak of barium titanate was observed. It is noted that the melting point of barium titanate is 1,637° C.

Figure 3:
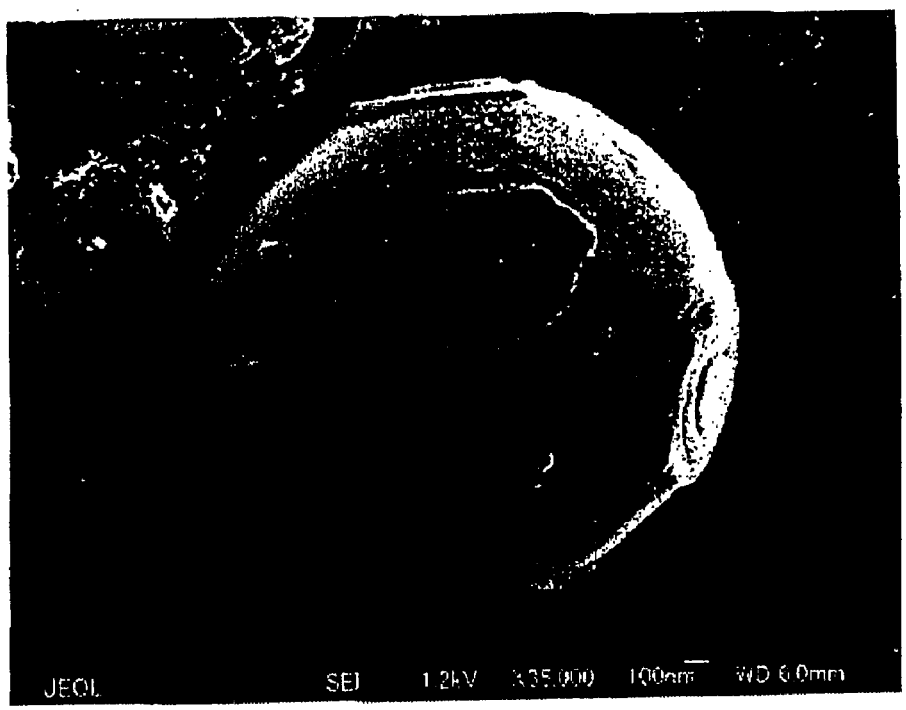
FIG. 3 is a photograph of an SEM image of the ceramic powder obtained in accordance with the first embodiment of the present invention.

Also, the barium titanate powder was observed through a scanning electron microscope (SEM). As a result, it was verified that the powder was composed of particles extremely close to perfect spheres with particle size of about 0.1–10 μm and that there were no aggregation in the powder. Moreover, when the mean particle size was measured, it was learned that the size was about 2.5 μm and that the sphericity of the particles was about 1. FIG. 3 shows a magnified photo of the powder under SEM. A close observation of individual particles revealed that there are facets of symmetrical crystal faces throughout the entire particle surface. It was learned that these were single crystal particles free of particle boundary within the particles.

Figure 4:
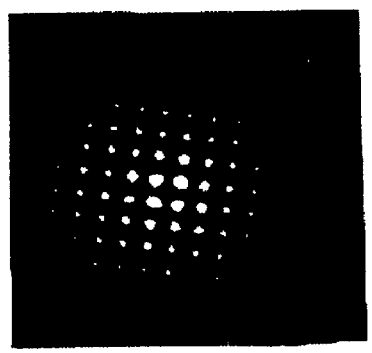
FIG. 4 is a photograph of an electron diffraction image of the ceramic powder obtained in accordance with the first embodiment of the present invention.

The powder thus obtained was also observed through a transmission electron microscope (TEM). FIG. 4 shows an electron diffraction image. It was verified that it has a structure with the unique regularity of powdered single crystals.

COMPARATIVE EXAMPLE 1

Figure 5:
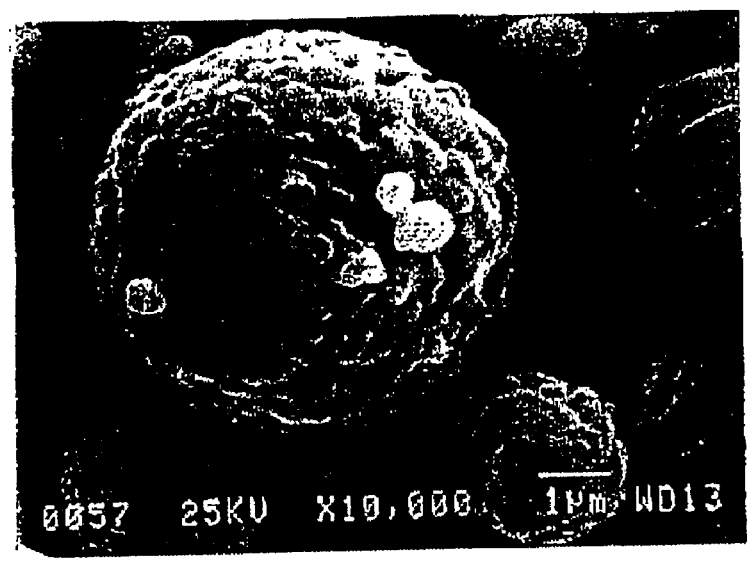
FIG. 5 is a photograph of an SEM image of ceramic powder obtained in accordance with a first comparative example.
Figure 6:
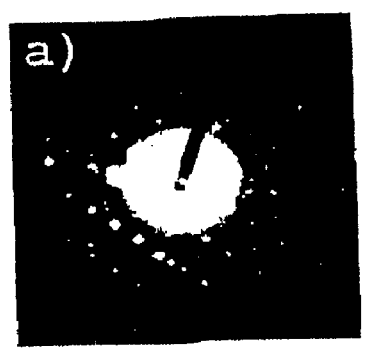
FIG. 6 is a photograph of an electron diffraction image of the ceramic powder obtained in accordance with the first comparative example.

Similar to Embodiment Example 1, except for the fact that the heating temperature was set at 1,400° C., barium titanate powder was obtained. FIG. 5 shows a magnified photo of the powder seen through an SEM. From FIG. 5, the existence of particle boundary on the surface of barium titanate particles was observed. Moreover, while an electron diffraction image is shown in FIG. 6, the results obtained from analyzing this electron diffraction image verified that the obtained powder was not a single crystal.

EMBODIMENT EXAMPLE 2

Ceramic powder was obtained in a manner similar to Embodiment Example 1, except for the fact that the molar ratio of barium oxide powder (BaO), titanium oxide ($TiO_2$) powder, neodymium oxide ($Nd_2O_3$) powder and manganese oxide (MnO) powder was at 13.8:54.7:31.4:0.1.

The mean particle size of the particles consisting of the powder thus obtained was 2.5 μm, and the shape of the fine particles were extremely close to a perfect sphere. Also, facets of symmetrical crystal faces were observed throughout the entire particle surface, and it was learned that these were single crystal particles free of particle boundary within the particles.

EMBODIMENT EXAMPLE 3

Ceramic powder was obtained through a method similar to Embodiment Example 2 except for the fact that granular powder was obtained using the spray method to form granular particles so that the granular powder would come in the smallest shape possible. The mean particle size for the granular powder was 9.1 μm.

Observation of the particles thus obtained verified that the single crystal particles were virtually the same as those obtained in Embodiment Example 2.

EMBODIMENT EXAMPLE 4

Slurry of iron oxide (Fe2O3), nickel oxide ($NiO_3$) and zinc oxide (ZnO) powder was obtained by adding water to the powder weighing at a molar ratio of 45.3:47.1:7.6 and mixing them for 12 hours in a ball mill (hereafter referred to as No. 1 slurry). Also, before the mixing, a dispersant (A-30SL manufactured by Toa Gosei Co.) was added to the powder at a weight percentage of 1%.

The drying and granulizing of No. 1 slurry was performed with a spray drier equipment. While there is no particular conditions set for the spraying and drying, it is recommended that the conditions be set so the granular powder will have a particle size of 200 μm or less.

A composite sintered oxide was obtained by firing the granular powder for one hour at 1,000° C. After adding water to this sintered powder and adding dispersants (A-30SL manufactured by Toa Gosei Co.) at a weight ratio of 1% to the sintered powder, the substance was pulverized for 48 hours by using a ball mill to create slurry (No. 2 slurry) containing primary particles with a mean particle size of 0.3 μm. A polyvinyl alcohol (PVA) solution diluted to 10 wt % in ratio was added at a weight percentage of 2 wt % against the total weight of powder, and an adjustment was made to bring the powder content in the slurry to 60 wt %.

The spray drying method was used on the No. 2 slurry to create granular powder. The spray drier used was model MDL-050 manufactured by Fujisaki Denki Co. Using a four-fluid type nozzle, the conditions were set at 40 cc/minute for liquid feeding volume, 160 NL/minute for nozzle air volume and gas supply temperature of 190° C. The granular powder thus obtained had a particle size of 8.9 μm.

Using nitrogen as the carrier gas, the granular powder was sent to a heater furnace using electricity as the heater source and comprising a ceramic tube. The temperature within the furnace (heat processing temperature) was 1,500° C. The flow of carrier gas was set at 0.8 liters/minute, and adjustments were made to keep the granular powder within the ceramic tube for about 1–10 seconds. In this manner ceramic powder (magnetic ferrite material) was obtained from the granular powder.

Figure 7:
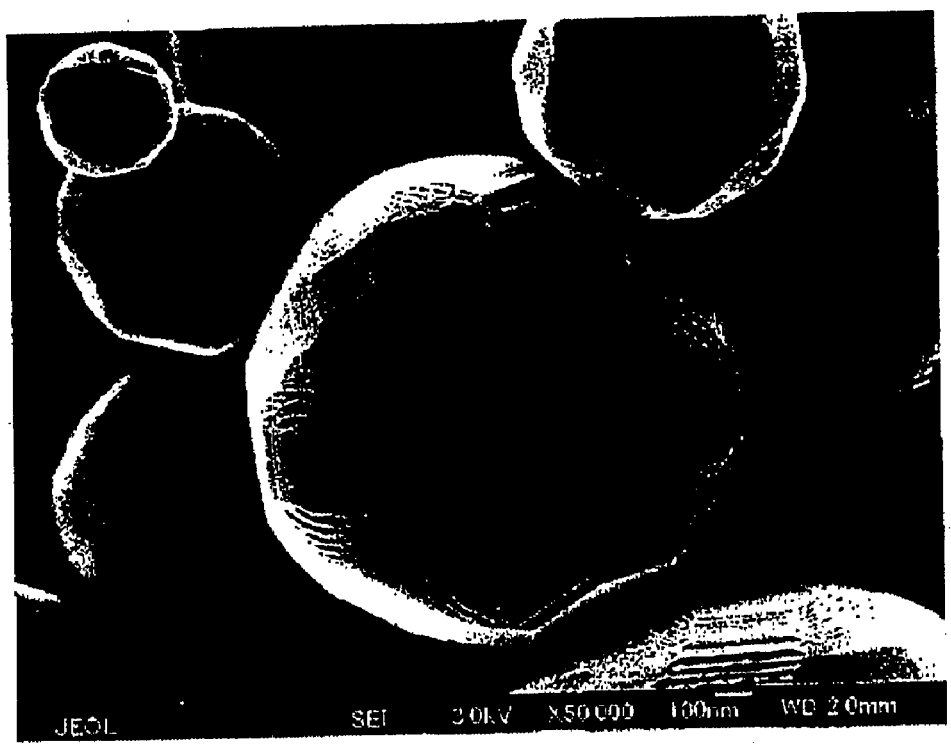
FIG. 7 is a photograph of an SEM image of ceramic powder obtained in accordance with a fourth embodiment of the present invention.

The composition of the powder thus obtained was observed with X-ray diffraction, using a fluorescence X-ray diffraction equipment. As a result, it was verified that the powder was composed of single phase Ni—Cu—Zn ferrite as no peak of $Fe_2O_3$, $Fe_3O_4$, FeO, $NiFe_2O_4$, $ZnFe_2O_4$ or $CuFe_2O_4$ was observed An SEM was used to observe the Ni—Cu—Zn ferrite powder. As a result, it was verified the powder consisted of particles extremely close to perfect spheres with a particle size of about 0.1–10 μm and that there were no aggregation of the powder. Moreover, when the mean particle size was measured, it was learned that the mean particle size was about 2.5 μm and that the sphericity of the particles was about 1. FIG. 7 shows a magnified photo of the powder under SEM. An observation of individual particles showed that facets of symmetrical crystal faces were observed throughout the entire particle surface. It was learned that these were single crystal particles free of particle boundaries within the particles.

Moreover, an oscillating magnetic force meter was used to measure the magnetic characteristics of single crystal ceramic powder. The results are shown in Table 1 and FIG. 8. The magnetic characteristics will be explained later.

Next, slurry (No. 3 slurry) was made by mixing single crystal ceramic powder at a ratio of 40 vol % to epoxy resin. The epoxy resin contained epi-bis type epoxy resins (Epikote 1001 and Epikote 1007 manufactured by Yuka Shell Epoxy K.K.) as polyfunctional epoxy resins at a ratio of 26.9 wt % each, 23.1 wt % of bisphenol A type high molecular weight epoxy resin (Epikote 1225 manufactured by Yuka Shell Epoxy K.K.), and 23.1 wt % of tetraphenylolethane type epoxy resin (Epikote 1031S manufactured by Yuka Shell Epoxy K.K.) as an epoxy resin having a special skeleton, which were mixed as the main ingredients. Bisphenol A type novolac resin (YLF129B65 manufactured by Yuka Shell Epoxy K.K.) as a curing agent and an imidazole compound (2E4MZ manufactured by Shikoku Chemicals K.K.) as a curing accelerator were added to the epoxy resin, and dissolved into toluene and methyl ethyl ketone. The ferrite single crystal particles were added to this epoxy resin, dispersed and mixed with a ball mill.

Figure 10:
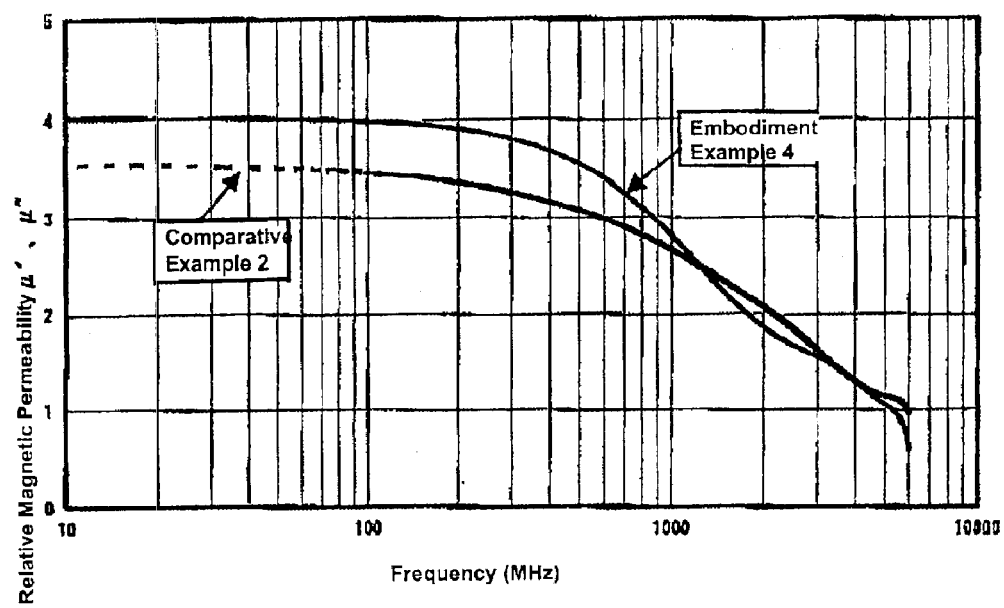
FIG. 10 is a graph showing relative magnetic permeability of substrates that are formed by using the ceramic powder obtained by the fourth embodiment of the present invention and the second comparative example, respectively.

The No. 3 slurry thus obtained was applied onto a glass cloth to create semi-hardened prepreg to be used as a base material for a substrate. For forming the semi-hardened prepreg, the slurry on the glass cloth was heated for two hours at 100° C. until it acquired the semi-hardened state. H, E or D glasses may be used for the glass cloth, and may be selected in terms of the required characteristics. But in this case, the E-glass was used. As for the thickness of the glass, any appropriate thickness may be selected depending on the requirements. In this case, a glass cloth having a thickness of 100 μm was used. A predetermined number of the semi-hardened prepreg on the glass cloths were stacked together, followed by heating and compressing into a composite magnetic material with a thickness of about 0.4 mm. This composite magnetic material was molded into a toroidal shape to obtain a substrate. The frequency characteristics of the magnetic permeability of the substrate were measured. The results are shown in FIG. 10.

COMPARATIVE EXAMPLE 2

Iron oxide ($Fe_2O_3$), nickel oxide ($NiO_2$) and Zinc oxide (ZnO) powder were added to water weighing at a molar ratio of 45.3:47.1:7.6 and mixed for 12 hours in a ball mill to obtain slurry (hereafter referred to as No. 1 slurry). Prior to the mixing, dispersant agent (A-30SL manufactured by Toa Gosei Co.) was added at a ratio of 1% to the weight of the powder.

The No. 1 slurry was spray dried into granule.

By firing the granular powder thus obtained for one hour at 1,000° C., a composite sintered oxide was obtained. By pulverizing this sintered oxide in a ball mill for 12 hours, powder with a mean particle size of 3 μm was obtained. As in the case of Embodiment Example 4, the magnetic characteristics of the powder were measured. The results are shown in Table 1 and FIG. 9.

The composite magnetic material was created by using the same method as Embodiment Example 4, except for the fact that the powder mentioned above was used, and the frequency characteristics of the magnetic permeability was measured. The results are shown in FIG. 10.

TABLE 1

|  | Saturation Magnetic Flux Density Bs (G) | Magnetic Coercive Force Ho (Oe) |
|---|---|---|
| Embodiment Example 4 | 3125 | 0.091 |
| Comparative Example 2 | 2978 | 0.189 |

MAGNETIC CHARACTERISTICS MEASURED IN EMBODIMENT EXAMPLE 4 AND COMPARATIVE EXAMPLE 2

Figure 8:
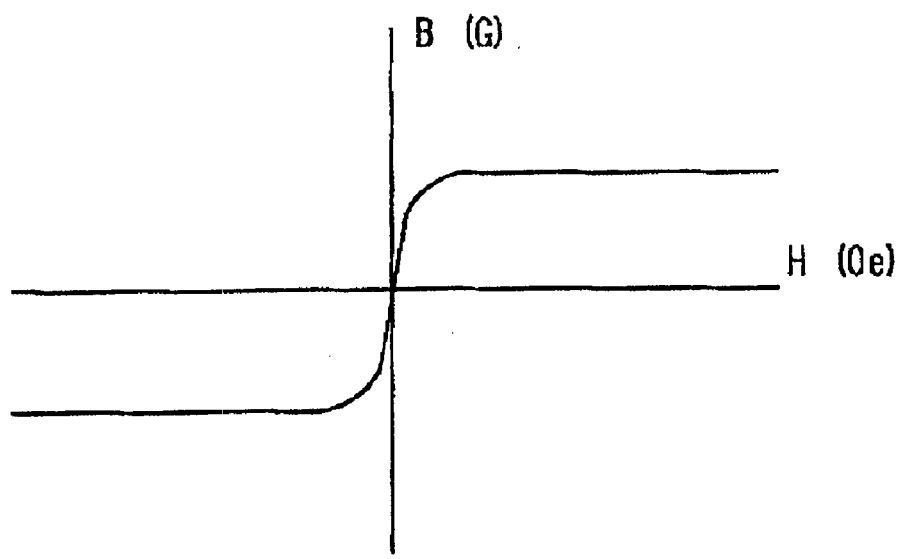
FIG. 8 is a graph showing magnetic characteristics of the ceramic powder obtained in accordance with the fourth embodiment of the present invention.
Figure 9:
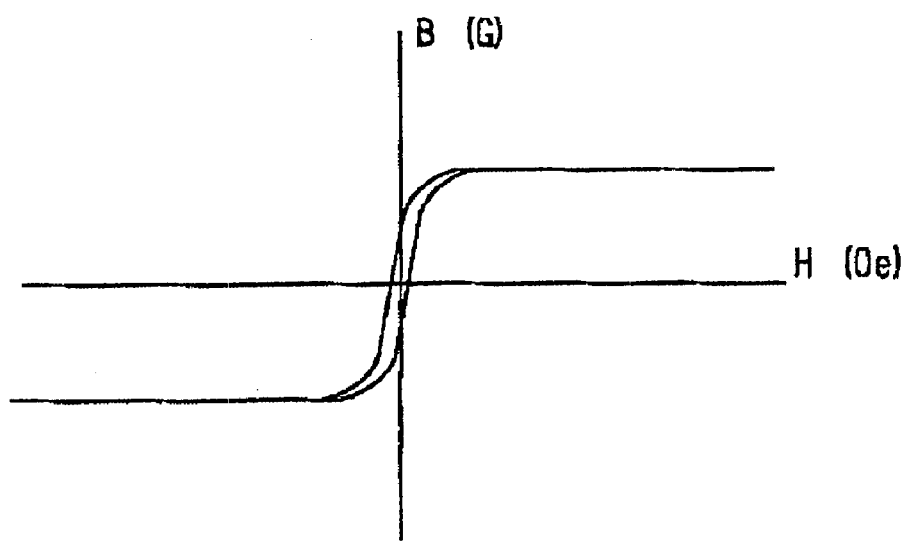
FIG. 9 is a graph showing magnetic characteristics of the ceramic powder obtained in accordance with a second comparative example.

As Table 1 shows, it is evident that the ferrite powder obtained under Embodiment Example 4 has a saturation magnetic flux density higher than that of the powder obtained through Comparative Example 2. FIGS. 8 and 9 show the hysteresis curve for the powder obtained from Embodiment Example 4 and Comparative Example 2. When the results of these two were compared, it was verified that there was a decline in the hysteresis loss in Embodiment Example 4 and that the loss was low for a magnetic ferrite material. Moreover, as shown in FIG. 10, when the frequency characteristics of magnetic permeability of Embodiment Example 4 and Comparative Example 2 are compared, it was verified that the characteristics of the composite magnetic material in Embodiment Example 4 exhibited a value 20% higher than that of Comparative Example 2 in the region reaching 1,000 MHz and slightly above.

EMBODIMENT EXAMPLE 5

First, slurry (No. 1 slurry) was obtained by adding water to magnesium oxide (MgO) and titanium oxide ($TiO_2$) powder weighed at a molar ratio of 1:1, followed by mixing the powder for 12 hours in a ball mill. When mixing the powder, a dispersant agent (A-30SL manufactured by Toa Gosei Co.) was added at a ratio of 1% to the total weight.

The No. 1 slurry was dried and granulized with a spray dryer to obtain a composite oxide granular powder. While there is no particular conditions set for the spray drying, the conditions may preferably be set so that the size of the granules will be less than 200 μm.

By firing these granules for one hour at 1,250° C., a composite oxide was reacted and sintered. Subsequently, water and a dispersant agent (A-30SL manufactured by Toa Gosei Co.) were added to this composite oxide, and the mixture was again pulverized for 48 hours with a ball mill to create slurry (No. 2 slurry), which consists of fine powder with particle size averaging 0.5 μm. Polyvinyl alcohol (PVA) solution diluted to 10 wt % ratio was added to the No. 2 slurry at 2 wt % ratio to the total powder weight, and an adjustment was made so that the powder within the No. 2 slurry would be 40 wt % of the total weight.

Granular powder was prepared by using the spray drying method on the No. 2 slurry. The spray drier was the MDL-050 model manufactured by Fujisaki Denki Co. A four-fluid type nozzle was used, and the conditions were set for the slurry to be sent at 40 cc/minute for solution feeding volume, nozzle air volume at 160 NL/minute and gas supply temperature at 190° C. The granular powder so obtained had a mean particle size of 9.7 μm.

Next, the granular powder thus obtained was fed to the ceramic tube heated to 1,600° C., using a mixture of nitrogen and oxygen as the carrier gas. Moreover, the carrier gas flow was adjusted so that the powder would remain in the tube for about 1–10 seconds.

An X-ray diffraction analysis using a luminescent X-ray analysis apparatus was conducted on the powder obtained by passing through the ceramic tube. The analysis results revealed that the powder was single phase magnesium titanate. When the magnesium titanate so obtained was observed with SEM, it was verified that there were no aggregation of the powder. Also, it was verified that the powder consisted of fine particles extremely close to perfect sphere with particle size of about 0.1–10 μm. The mean particle size was about 1.5 μm and the sphericity was about 1. When the respective particles were observed, symmetrical crystal face facets were observed throughout the entire particle surface. It was learned that the particles were single crystals free of particle boundaries within the particles.

The above single crystal ceramic powder and a glass material (GA-60, $MgO.B_2O_3.SiO_2$ type glass, with a mean particle size of 0.15 μm, manufactured by Nippon Denki Glass Co.) having a substantially different firing temperature were measured such that the single crystal ceramic powder would be 65 volume %. The measured material was mixed in slurry containing polyvinyl butyral (ESLEC BH-3 manufactured by Sekisui Chemical Co., Ltd.) dissolved in a mixed solvent of toluene and ethanol to create dielectric slurry.

A ball mill was used for mixing the material to assure uniform mixture and dispersion. The mixed material then is formed into a green sheet about 200 μm thick using a doctor blade technique. Subsequently, a predetermined number of green sheets were laminated in a thickness of about 1,300 μm, and fired for two hours at 900° C. to obtain sintered material. From this sintered material, stick shaped samples of 8 mm in length, 1 mm in width and 1 mm in thickness were created, and the dielectric constant and quality factor Q (=1/tan δ) of the samples were measured. As Comparative Example 3, sintered material was created under a condition in which only the aforementioned glass material was maintained at 900° C. for two hours, and its characteristics were measured. The results are shown in Table 2.

Embodiment Example 5 suggests that even at a low firing temperature of 900° C., a composite material with a quality factor Q larger than that of the glass itself can be obtained. Also, as single crystal magnesium titanate powder is used, the reaction between glass and magnesium titanate is limited only to the surface during the firing process. It is understood that the decline in quality factor Q of magnesium titanate can be minimized. As a result, a composite material with a high quality factor Q can be realized.

TABLE 2

|  | ε | Q |
|---|---|---|
| Embodiment Example 5 | 5.2 | 458 |
| Comparative Example 3 | 5.2 | 281 |

Measuring frequency: 2 GHz

EMBODIMENT EXAMPLE 6

Figure 13:
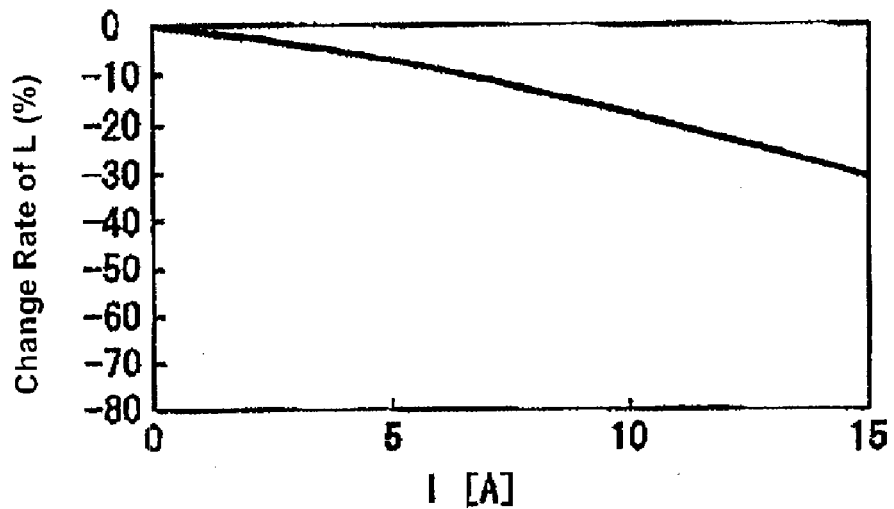
FIG. 13 is a graph indicating changes of the inductance value "L" of a composite magnetic material in accordance with a sixth embodiment of the present invention.
Figure 14:
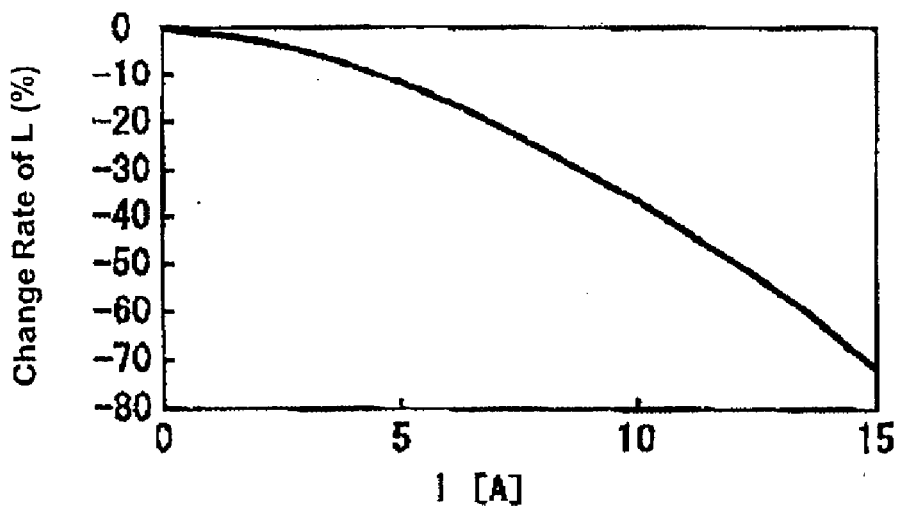
FIG. 14 is a graph indicating changes of the inductance value "L" of a magnetic material in accordance with a fourth comparative example.

Single crystal ferrite powder obtained in Embodiment Example 4 was prepared. In the mean time, polycrystalline ferrite powder with a mean particle size of 0.07 μm was prepared by using a solid-phase reaction method (sintering method) with iron oxide ($Fe_2O_3$), nickel oxide ($NiO_2$), copper oxide (CuO) and zinc oxide (ZnO) being weighed at a molar ratio of 45.3:47.1:5.0:7.6. Single crystal ferrite powder and polycrystalline ferrite powder were weighed and mixed so that the aforementioned single crystal ferrite powder was 65 volume %. After molding this mixed powder into a toroidal form, it was maintained at 900° C. for one hour to obtain a sintered material. An evaluation sample was then obtained by winding a coil on the sintered material to provide an inductance value L at 1 μH. DC bias characteristics of this sample were evaluated. A similar evaluation was made on a sintered substance comprising only of the above polycrystalline ferrite powder. The results are shown in FIGS. 13 (Embodiment Example 6) and 14 (Comparative Example 4). It was verified that Embodiment Example 6 consisting of single crystal ferrite powder and polycrystalline ferrite powder exhibited very little change in the inductance value L, and that it was possible to use this at a high current level.

As explained above, this invention can be used to obtain spherical shaped and single crystal ceramic powder.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for manufacturing single crystal ceramic powder, the method comprising:

a powder supply step for supplying powder consisting essentially of ceramic ingredients to a heat treatment area with a carrier gas;

a heat treatment step for heating the powder supplied to the heat treatment area at temperatures above a melting point of the powder to form a product wherein the heat treatment is conducted in an electric tube type furnace; and a cooling step for cooling the product obtained in the heat treatment step to form single crystal ceramic powder.

2. A method for manufacturing single crystal ceramic powder according to claim 1, wherein the single crystal ceramic powder has a sphericity being 0.9 or higher.

3. A method for manufacturing single crystal ceramic powder according to claim 1, wherein, in the heat treatment step, the powder consisting essentially of ceramic ingredients is melted to form a melt.

4. A method for manufacturing single crystal ceramic powder according to claim 1, wherein the powder consisting essentially of ceramic ingredients consists of particles having a particle size of about 50 μm or less.

5. A method for manufacturing single crystal ceramic powder, the method comprising;

suspending and moving powder consisting essentially of ceramic ingredients in an electric tube type heating furnace to obtain a product; and cooling the product to form single crystal ceramic powder with a sphericity being more than about 0.9.

6. A method for manufacturing single crystal ceramic powder according to claim 5, wherein the powder is suspended in a gas flowing in the heating furnace.

7. A single crystal non-ferrite ceramic powder consisting essentially of single crystal non-ferrite ceramic particles having a mean particle size of about 1–20 μm and a sphericity of about 0.9 or greater, wherein said non-ferrite ceramic powder comprises at least one selected from a group consisting of barium titanate-neodymium ceramics, barium titanate-tin ceramics, lead-calcium ceramics, titanium dioxide ceramics, barium titanate ceramics, lead titanate ceramics, strontium titanate ceramics, calcium titanate ceramics, bismuth titanate ceramics, magnesium titanate ceramics, $CaWO_4$ ceramics, Ba (Mg, Nb) $O_3$ ceramics, Ba (Mg, Ta) $O_3$ ceramics, Ba (Co, Mg, Nb) $O_3$ ceramics and Ba (Co, Mg, Ta) $O_3$ ceramics.

8. A composite material comprising generally spherical single crystal non-ferrite oxide powder, and a resin-based bonding material for dispersing and retaining the generally spherical single crystal non-ferrite oxide powder, wherein the generally spherical single crystal non-ferrite oxide powder consists essentially of particles having a mean particle size of about 1–20 μm and a sphericity of about 0.9 or higher.

9. A composite material according to claim 8, wherein the generally spherical single crystal oxide powder consists essentially of a dielectric material.

10. A composite material according to claim 8 containing the generally spherical single crystal non-ferrite oxide powder within a range of about 30–98 wt %.

11. A composite material comprising generally spherical single crystal non-ferrite oxide powder, and a bonding material, wherein the generally spherical single crystal non-ferrite oxide powder consists essentially of a dielectric material, and the bonding material is formed from a dielectric ceramic material having a lower melting point than a melting point of the dielectric material of the generally spherical single crystal non-ferrite oxide powder.

12. A composite material according to claim 11, containing the generally spherical single crystal oxide powder within a range of about 30–70 volume %.

13. A composite material comprising generally spherical single crystal oxide powder, and a bonding material for dispersing and retaining the generally spherical single crystal oxide powder, wherein the generally spherical single crystal oxide powder consists essentially of a magnetic material, and the bonding material is formed from an oxide magnetic material having a lower melting point than a melting point of the magnetic material of the generally spherical single crystal oxide powder.

14. A composite material according to claim 13 containing the generally spherical single crystal oxide powder within a range of about 30–70 volume %.

15. An electronic component comprising at least one dielectric layer and at least one internal metal electrode arranged on the at least one dielectric layer, wherein the at least one dielectric layer is formed from a composite material comprising generally spherical single crystal oxide powder consisting essentially of a dielectric material, and a bonding material for dispersing and retaining the generally spherical single crystal oxide powder, wherein the generally spherical single crystal oxide powder consists essentially of particles having a mean particle size of about 1–20 $\mu$m and a sphericity of about 0.9 or higher, and the bonding material is formed from a dielectric ceramic material or a resin material.

16. An electronic component comprising at least one magnetic layer and at least one internal metal electrode arranged on the at least one magnetic layer, wherein the at least one magnetic layer is formed from a composite material comprising generally spherical single crystal oxide powder consisting essentially of a magnetic material, and a bonding material for dispersing and retaining the generally spherical single crystal oxide powder, wherein the generally spherical single crystal oxide powder consists essentially of particles having a mean particle size of about 0.1–30 $\mu$m and a sphericity of about 0.9 or higher, and the bonding material is formed from a magnetic ceramic material or a resin material.

17. A method for manufacturing single crystal ceramic powder, the method comprising:

a powder supply step for supplying powder consisting essentially of ceramic ingredients to a heat treatment area with a carrier gas wherein said powder is in granule;

a heat treatment step for heating the powder supplied to the heat treatment area at temperatures above a melting point of the powder to form a product; and a cooling step for cooling the product obtained in the heat treatment step to form single crystal ceramic powder.

18. A method for manufacturing single crystal ceramic powder according to claim 17, wherein the heat treatment step is conducted in an electric tube type furnace.

19. A method for manufacturing single crystal ceramic powder, the method comprising;

suspending and moving powder consisting essentially of ceramic ingredients in a heating furnace to obtain a product, wherein the powder consisting essentially of ceramic ingredients is in granule; and cooling the product to form single crystal ceramic powder with a sphericity being more than about 0.9.

20. A method for manufacturing single crystal ceramic powder according to claim 17, wherein the single crystal ceramic powder has a sphericity being 0.9 or higher.

21. A method for manufacturing single crystal ceramic powder according to claim 17, wherein, in the heat treatment step, the powder consisting essentially of ceramic ingredients is melted to form a melt.

22. A method for manufacturing single crystal ceramic powder according to claim 17, wherein the powder consisting essentially of ceramic ingredients is in granule created from primary particles having a mean particle size of about 1 $\mu$m or less.

* * * * *